United States Patent
Sato

(10) Patent No.: US 11,869,838 B2
(45) Date of Patent: Jan. 9, 2024

(54) SEMICONDUCTOR STORAGE DEVICE

(71) Applicant: Kioxia Corporation, Tokyo (JP)

(72) Inventor: Taisuke Sato, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 234 days.

(21) Appl. No.: 17/190,886

(22) Filed: Mar. 3, 2021

(65) Prior Publication Data

US 2021/0375752 A1 Dec. 2, 2021

(30) Foreign Application Priority Data

May 29, 2020 (JP) .................................. 2020-094728

(51) Int. Cl.
*H01L 23/522* (2006.01)
*H01L 23/528* (2006.01)
*H10B 41/27* (2023.01)
*H10B 43/27* (2023.01)

(52) U.S. Cl.
CPC ...... *H01L 23/5226* (2013.01); *H01L 23/5283* (2013.01); *H10B 41/27* (2023.02); *H10B 43/27* (2023.02)

(58) Field of Classification Search
CPC ............. H01L 23/5226; H01L 23/5283; H01L 27/11556
See application file for complete search history.

(56) References Cited

U.S. PATENT DOCUMENTS

| | | |
|---|---|---|
| 8,309,405 B2 | 11/2012 | Yang et al. |
| 9,716,105 B1 | 7/2017 | Tsutsumi |
| 9,960,180 B1 * | 5/2018 | Zhou .................. H01L 29/40117 |
| 10,475,515 B2 | 11/2019 | Li et al. |
| 2017/0110472 A1 | 4/2017 | Hu |
| 2017/0179150 A1 | 6/2017 | Shimura |
| 2017/0263558 A1 | 9/2017 | Shingu et al. |
| 2017/0278859 A1 * | 9/2017 | Sharangpani ..... H01L 29/40117 |
| 2019/0348435 A1 | 11/2019 | Nagata et al. |
| 2019/0371812 A1 | 12/2019 | Oike |
| 2020/0075100 A1 | 3/2020 | Yagi |
| 2020/0075623 A1 | 3/2020 | Ito et al. |
| 2020/0127005 A1 | 4/2020 | Otsu et al. |
| 2020/0388626 A1 * | 12/2020 | Baraskar ............. H01L 21/8239 |

FOREIGN PATENT DOCUMENTS

JP 2012-080105 A 4/2012

* cited by examiner

*Primary Examiner* — Jay C Kim
*Assistant Examiner* — Woo K Lee
(74) *Attorney, Agent, or Firm* — Foley & Lardner LLP

(57) ABSTRACT

A semiconductor storage device includes: a substrate; a stacked body; a columnar body; and a single-crystalline body. The stacked body includes a cell array region where first insulating layers and conductive layers are alternately stacked. The columnar body has a first columnar body. The first columnar body includes a semiconductor body and a charge accumulation film provided between one of a plurality of the conductive layers and the semiconductor body, and is present in the cell array region. The conductive layer that surrounds an outer periphery of the single-crystalline body and that is closest to the substrate among the conductive layers is a first layer, and that the conductive layer that surrounds an outer periphery of the first columnar body and that is closest to the substrate among the conductive layers is a second layer.

8 Claims, 14 Drawing Sheets

SEMICONDUCTOR STORAGE DEVICE

CROSS-REFERENCE TO RELATED APPLICATION(S)

This application is based upon and claims the benefit of priority from Japanese Patent Application No. 2020-094728, filed May 29, 2020, the entire contents of which are incorporated herein by reference.

FIELD

Embodiments described herein relate generally to a semiconductor storage device.

BACKGROUND

A NAND flash memory in which memory cells are stacked three-dimensionally is known.

DETAILED DESCRIPTION

Figure 1:
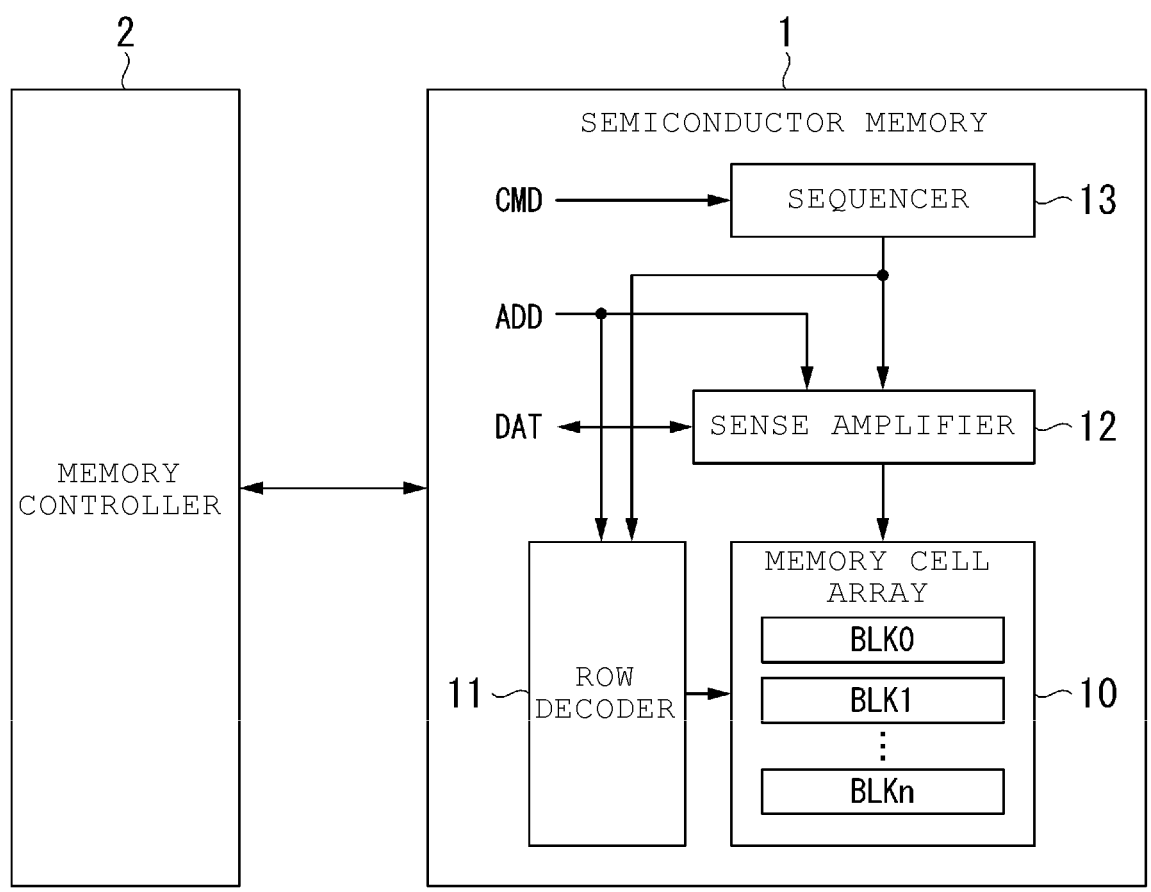
FIG. 1 is a block diagram showing circuit configurations of a semiconductor storage device according to a first embodiment.

At least one embodiment provides a semiconductor storage device capable of preventing a malfunction caused by a short-circuit.

In general, according to at least one embodiment, a semiconductor storage device includes: a substrate; a stacked body; a columnar body; and a single-crystalline body. The stacked body is stacked on the substrate. The columnar body extends in a first direction crossing the substrate in the stacked boy. The single-crystalline body projects from the substrate into the columnar body and lies between the columnar body and the substrate. The stacked body includes a cell array region where first insulating layers and conductive layers are alternately stacked. The columnar body has a first columnar body. The first columnar body is present in the cell array region, and includes a semiconductor body and a charge accumulation film provided between at least one of a plurality of the conductive layers and the semiconductor body. The conductive layer that surrounds an outer periphery of the single-crystalline body and that is closest to the substrate among the conductive layers is a first layer, and the conductive layer that surrounds an outer periphery of the first columnar body and that is closest to the substrate among the conductive layers is a second layer. The second layer is present outward of the first layer in a radial direction of the first columnar body with reference to the first columnar body.

Embodiments of a semiconductor storage device will be described hereinafter with reference to the drawings. In the following description, configurations having same or similar functions are denoted by the same reference signs. Furthermore, repetitive description of those configurations is often omitted. The drawings are either schematic or conceptual, and a relationship between a thickness and a width of each portion, a ratio of magnitudes of the portions, and the like are not necessarily identical to actual ones. In the present specification, "connection" is not limited to a case of physical connection and also includes a case of electrical connection. In the present specification, "extend in an A direction" means, for example, that the dimensions in the A direction are larger than minimum dimensions among dimensions in an X direction, a Y direction, and a Z direction, to be described later. The "A direction" is a freely selected direction.

Furthermore, the X direction, the Y direction, and the Z direction are defined first. The X direction and the Y direction are directions generally in parallel to a front surface of a substrate 20 to be described later (see FIG. 4). The Y direction is a direction in which slits SLT, to be described later, extend. The X direction is a direction crossing (for example, generally orthogonal to) the Y direction. The Z direction is a direction crossing (for example, generally orthogonal to) the X and Y directions and apart from the substrate 20. These expressions are given for the convenience sake and not intended to specify a gravity direction. In the present embodiments, the Z direction is an example of a "first direction."

First Embodiment

FIG. 1 is a block diagram showing system configurations of a semiconductor memory 1. The semiconductor memory 1 is a nonvolatile semiconductor storage device and, for example, a NAND flash memory. The semiconductor memory 1 is configured with, for example, a memory cell array 10, a row decoder 11, a sense amplifier 12, and a sequencer 13.

The memory cell array 10 includes a plurality of blocks BLK0 to BLKn (where n is an integer equal to or greater than 1). The block BLK is a set of nonvolatile memory cell transistors MTs (see FIG. 2). A plurality of bit lines and a plurality of word lines are provided in the memory cell array 10. Each memory cell transistor MT is connected to one bit line and one word line. Detailed configurations of the memory cell array 10 will be described later.

The row decoder 11 selects one block BLK on the basis of address information ADD received from an external memory controller 2. The row decoder 11 controls a write operation and a read operation with respect to the memory cell array 10 by applying a desired voltage to each of the plurality of word lines.

The sense amplifier 12 applies a desired voltage to each bit line in response to write data DAT received from the memory controller 2. The sense amplifier 12 determines data stored in each memory cell transistor MT on the basis of a voltage of the bit line, and transmits the determined read data DAT to the memory controller 2.

The sequencer 13 controls overall operations of the semiconductor memory 1 on the basis of a command CMD received from the memory controller 2.

The semiconductor memory 1 and the memory controller 2 described above may configure one semiconductor device by a combination of the semiconductor memory 1 and the memory controller 2. Examples of the semiconductor device include a memory card such as an SD (registered trademark) card and an SSD (Solid State Drive).

Figure 2:
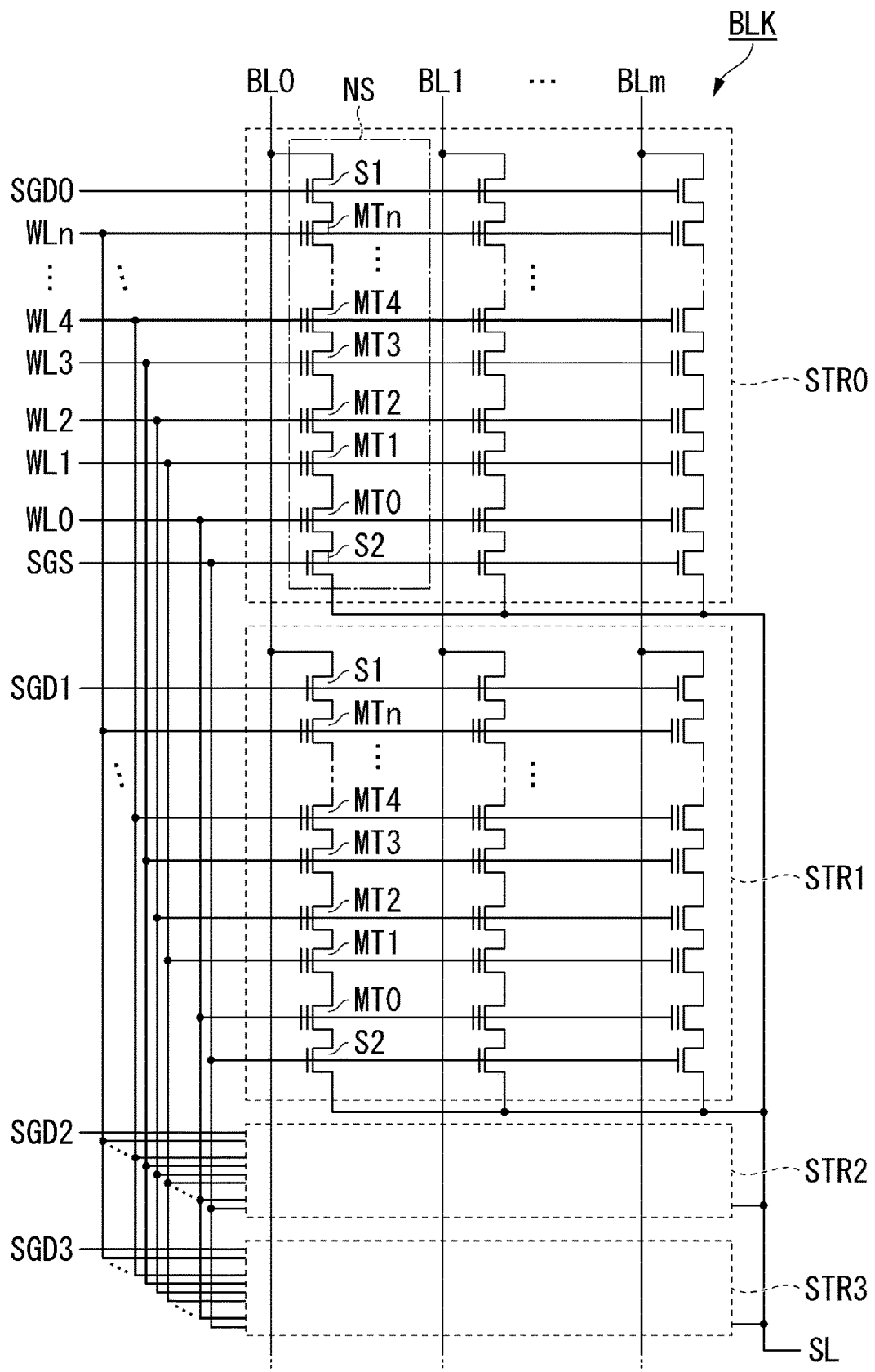
FIG. 2 is a circuit diagram of a memory cell array in the semiconductor storage device according to the first embodiment.

Electrical configurations of the memory cell array 10 will be described next. FIG. 2 is a diagram showing an equivalent circuit to the memory cell array 10, and shows one extracted block BLK. The block BLK includes a plurality of (four, for example) strings STR0 to STR3.

Each of the strings STR0 to STR3 is a set of a plurality of NAND strings NS (hereinafter, referred to as "NAND strings set"). One end of each NAND strings NS set is connected to any of bit lines BL0 to BLm (where m is an integer equal to or greater than 1). The other end of each NAND strings NS set is connected to a source line SL. Each NAND strings NS set may include a plurality of memory cell transistors MT0 to MTn (where n is an integer equal to or greater than 1), a first select transistor S1, and a second select transistor S2.

The plurality of memory cell transistors MT0 to MTn are electrically connected to one another in series. Each memory cell transistor MT includes a control gate and a charge accumulation film, and stores data in a nonvolatile manner. The memory cell transistor MT accumulates electric charges in the charge accumulation film in response to a voltage applied to the control gate. The control gate of the memory cell transistor MT is connected to one corresponding word line WL out of word lines WL0 to WLn. The memory cell transistor MT is electrically connected to the row decoder 11 via the word line WL.

The first select transistor S1 in each NAND strings NS set is connected between the plurality of memory cell transistors MT0 to MTn and any of the bit lines BL0 to BLm. A drain of the first select transistor S1 is connected to any of the bit lines BL0 to BLm. A source of the first select transistor S1 is connected to the memory cell transistor MTn. A control gate of the first select transistor S1 in each NAND strings NS set is connected to any of select gate lines SGD0 to SGD3. The first select transistor S1 is electrically connected to the row decoder 11 via the select gate line SGD. The first select transistor S1 connects the NAND strings NS set to the bit line BL when a predetermined voltage is applied to any of the select gate lines SGD0 to SGD3.

The second select transistor S2 in each NAND strings NS set is connected between the plurality of memory cell transistors MT0 to MTn and the source line SL. A drain of the second select transistor S2 is connected to the memory cell transistor MT0. A source of the second select transistor S2 is connected to the source line SL. A control gate of the second select transistor S2 in each NAND strings NS set is connected to a select gate line SGS. The second select transistor S2 is electrically connected to the row decoder 11 via the select gate line SGS. The second select transistor S2 connects the NAND strings NS set to the source line SL when a predetermined voltage is applied to the select gate line SGS.

Figure 3:
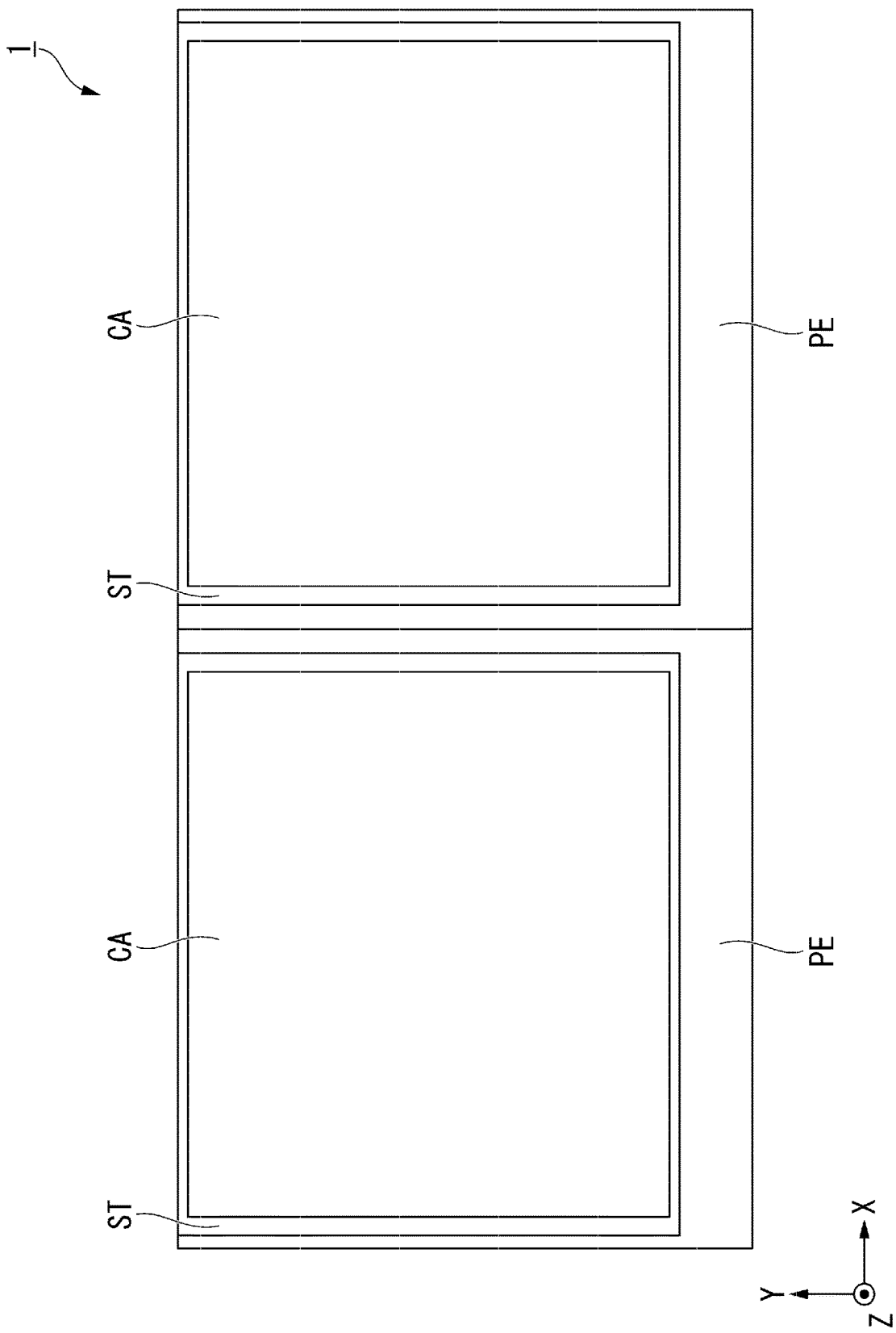
FIG. 3 is a plan view of the semiconductor storage device according to the first embodiment.
Figure 4:
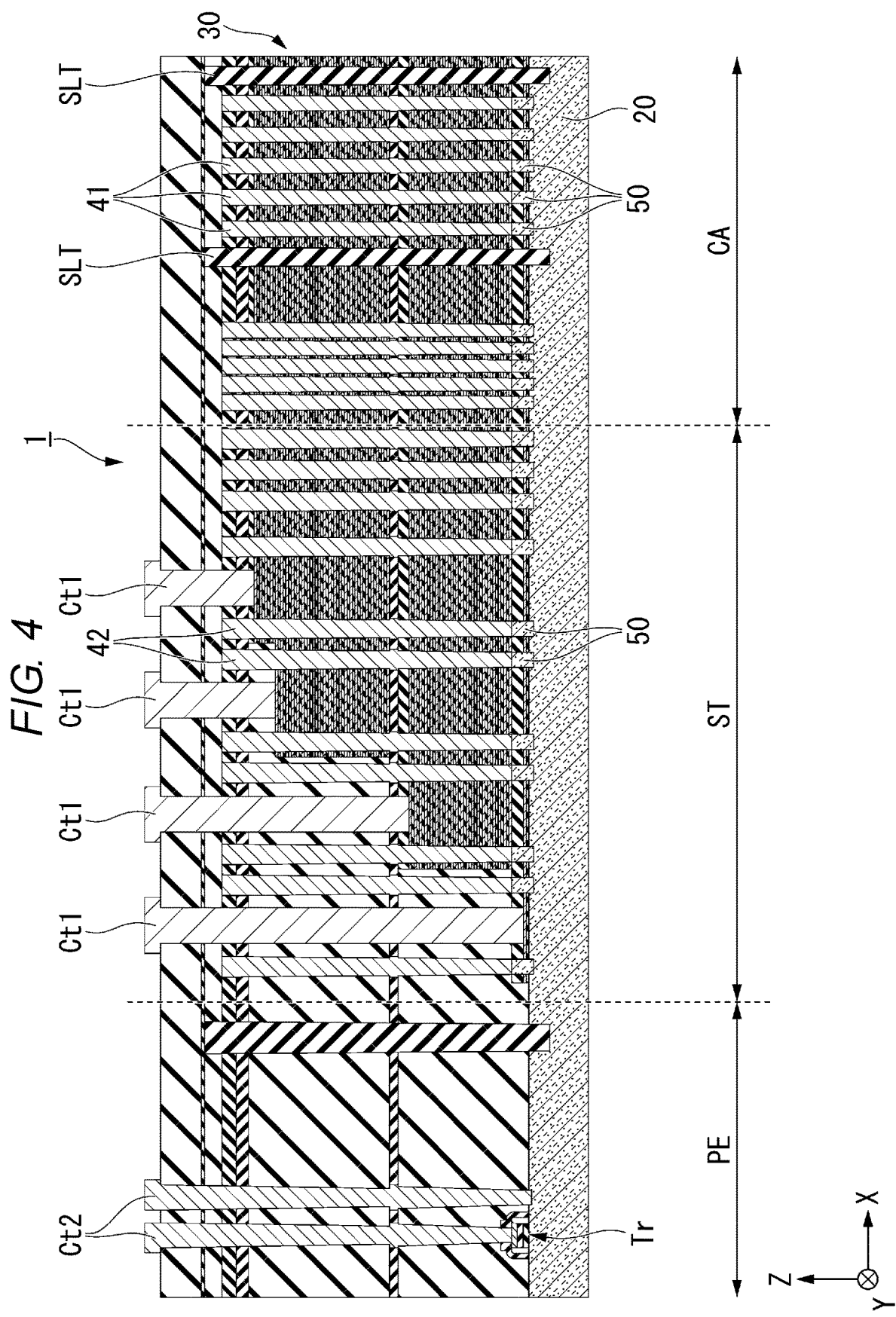
FIG. 4 is a cross-sectional view of the semiconductor storage device according to the first embodiment.

A structure of the memory cell array 10 will next be described. FIG. 3 is a plan view of the semiconductor memory 1 according to the first embodiment. FIG. 4 is a cross-sectional view of the semiconductor memory 1 according to the first embodiment. The semiconductor memory 1 has a substrate 20, a stacked body 30, a plurality of columnar bodies 41 and 42, and a plurality of single-crystalline bodies 50. The semiconductor memory 1 is demarcated into a cell array region CA, a stepped region ST, and a peripheral region PE.

The cell array region CA is a region where the memory cell transistors MT (see FIG. 2) that store data are arranged three-dimensionally. The cell array region CA has the substrate 20, the stacked body 30, a plurality of columnar bodies 41, a plurality of slits SLT, and the plurality of single-crystalline bodies 50. Each of the columnar bodies 41 is an example of a "first columnar body." Each of the plurality of columnar bodies 41 in the cell array region CA corresponds to the NAND strings NS set (see FIG. 2).

The stepped region ST is present around the cell array region CA. The stepped region ST is outward of the cell array region CA in, for example, the X direction or the Y direction. The stepped region ST has the substrate 20, the stacked body 30, a plurality of columnar bodies 42, and the plurality of single-crystalline bodies 50. Each of the columnar bodies 42 is an example of a "second columnar body." The stacked body 30 has a plurality of terraces and steps in the stepped region ST. The word lines WL0 to WLn are exposed on the plurality of terraces, respectively. Contacts Ct1 are connected to the plurality of terraces, respectively.

The contacts Ct1 connect the word lines WL0 to WLn (see FIG. 2) to interconnections (not shown). The stepped region ST is a region where a height of the stacked body 30 in the Z direction is reduced step by step from that of the stacked body 30 in the cell array region CA. The plurality of columnar bodies 42 in the stepped region ST are support mediums supporting the stacked body 30 in manufacturing processes.

The peripheral region PE is present, for example, around the cell array region CA and the stepped region ST. The peripheral region PE is a region where peripheral circuits controlling the memory cell transistors MT in the cell array region CA are provided. The peripheral region PE includes a plurality of transistors Tr controlling the cell array region CA. The transistors Tr are connected to interconnections controlling the transistors Tr via contacts Ct2. The peripheral region PE may be provided below the substrate 20 in the Z direction.

Figure 5:
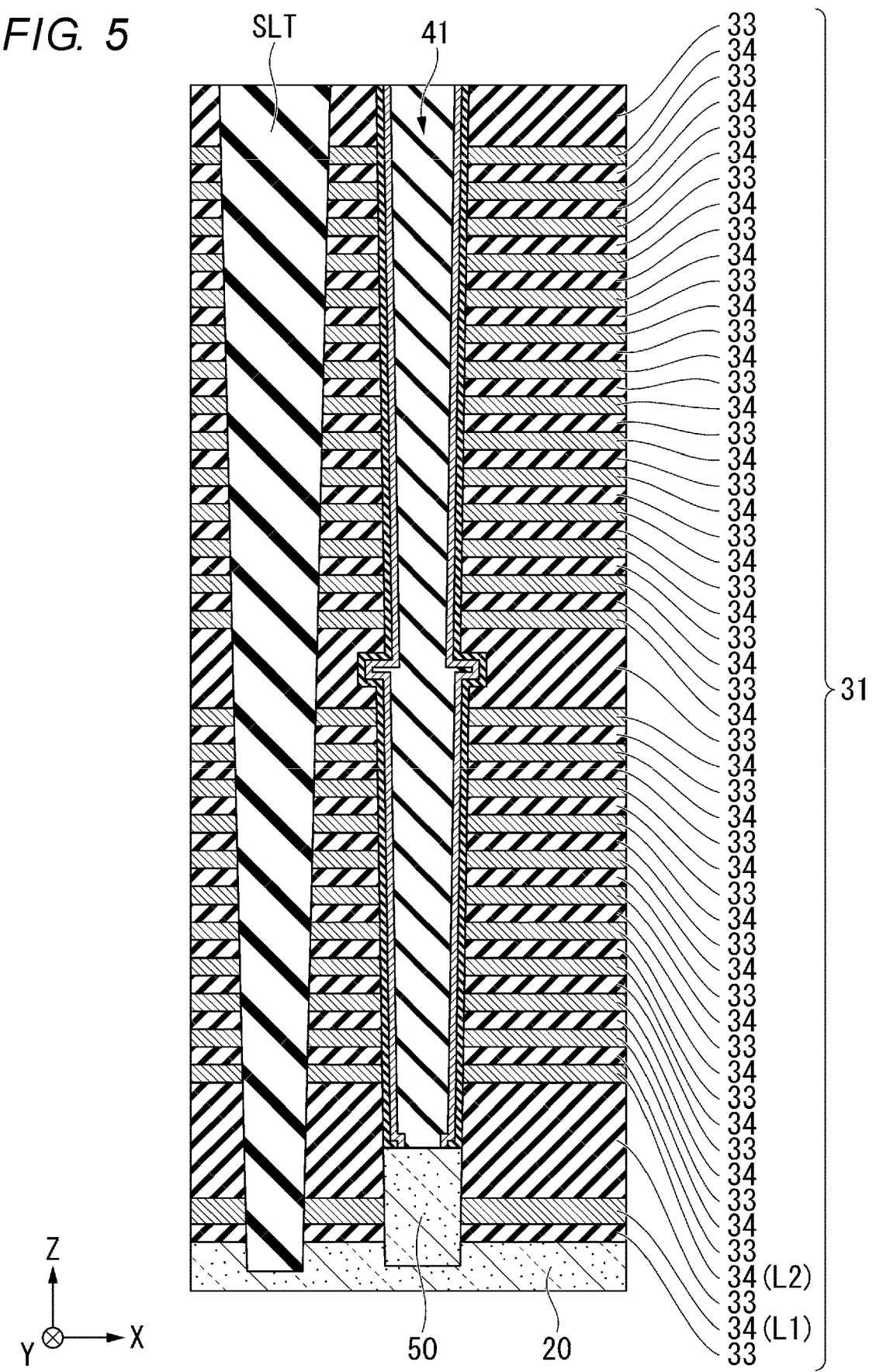
FIG. 5 is an enlarged cross-sectional view of neighborhoods of a columnar body in a cell array region in the semiconductor storage device according to the first embodiment.

FIG. 5 is an enlarged cross-sectional view of neighborhoods of the columnar body 41 in the cell array region CA in the semiconductor memory 1 according to the first embodiment. The cell array region CA has the substrate 20, a stacked body 31, the plurality of columnar bodies 41, the plurality of slits SLT, and the plurality of single-crystalline bodies 50. The stacked body 31 is a part, which belongs to the cell array region CA, of the stacked body 30.

The substrate 20 is, for example, a silicon substrate. The substrate 20 extends, for example, in the X and Y directions over the cell array region CA, the stepped region ST, and the peripheral region PE. The stacked body 30 is stacked on the substrate 20.

The stacked body 31 may have a plurality of insulating layers 33 and a plurality of conductive layers 34 in the Z direction. The insulating layers 33 and the conductive layers 34 are alternately stacked. Each of the insulating layers 33 is an example of a "first insulating layer."

The plurality of insulating layers 33 spread in the X and Y directions. The insulating layers 33 contain, for example, a silicon oxide. The insulating layers 33 lie between one conductive layer 34 and the substrate 20 and between the conductive layers 34 adjacent in the Z direction. The insulating layers 33 each insulate the adjacent conductive layers 34 from each other. The number of the insulating layers 33 is determined by the number of conductive layers 34.

The plurality of conductive layers 34 spread in the X and Y directions. The conductive layers 34 each contain, for example, tungsten and impurity-doped polysilicon. The number of conductive layers 34 is freely selected.

The conductive layers 34 are functionally divided into, for example, three types. The conductive layers 34 each function as any of the select gate line SGS, a gate electrode of the memory cell transistor MT, and the select gate line SGD.

Out of the conductive layers 34, the conductive layer 34 surrounding an outer periphery of each single-crystalline body 50 functions, for example, as the select gate line SGS connected to the second select transistor S2. The number of conductive layers 34 that function as the select gate lines SGS may be either one or two or more.

Out of the conductive layers 34, a few conductive layers 34 from the top of the stacked body 31 function, for example, as the select gate lines SGD connected to the first select transistors S1. The number of conductive layers 34 that function as the select gate lines SGD may be either one or two or more.

Out of the conductive layers 34, the conductive layers 34 functioning other than the select gate lines SGS and SGD function as gate electrodes of the memory cell transistors MT. The gate electrodes are each connected to one word line WL. These conductive layers 34 surround, for example, outer peripheries of the columnar bodies 41.

The plurality of columnar bodies 41 are present in the stacked body 31. The columnar bodies 41 may extend in the Z direction. For example, the columnar bodies 41 penetrate the stacked body 31 in the Z direction.

Figure 6:
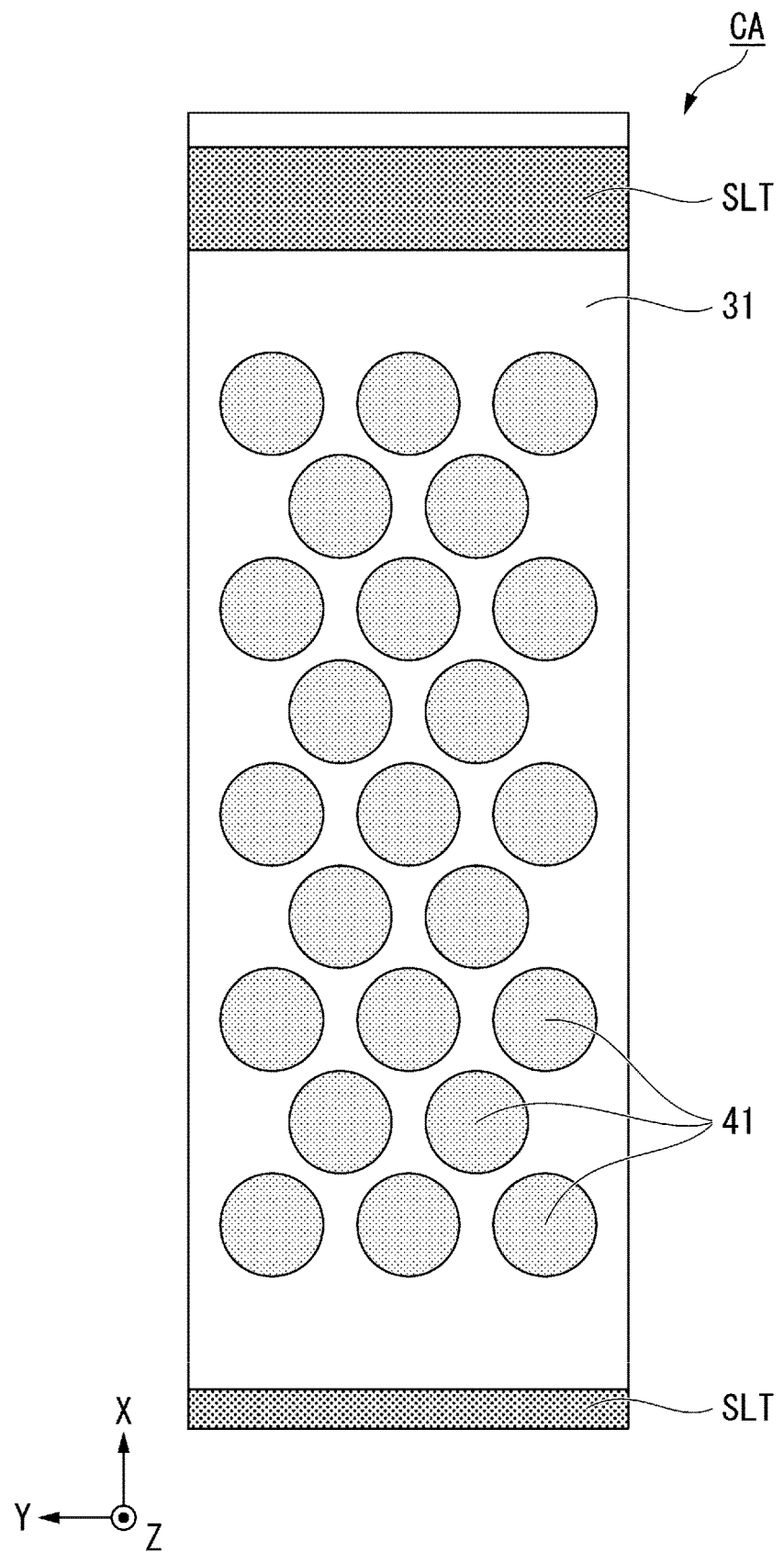
FIG. 6 is a plan view of the cell array region in the semiconductor storage device according to the first embodiment.

FIG. 6 is an enlarged plan view of a part of the cell array region CA in the semiconductor memory 1 according to the first embodiment. The cell array region CA is demarcated into the plurality of blocks BLKs by the slits SLT. The columnar bodies 41 are scattered in the cell array region CA. The plurality of columnar bodies 41 are arranged, for example, in a zigzag fashion in the X direction in a plan view from the Z direction. Each of the columnar bodies 41 is, for example, a circle or an ellipse in the plan view from the Z direction.

Figure 7:
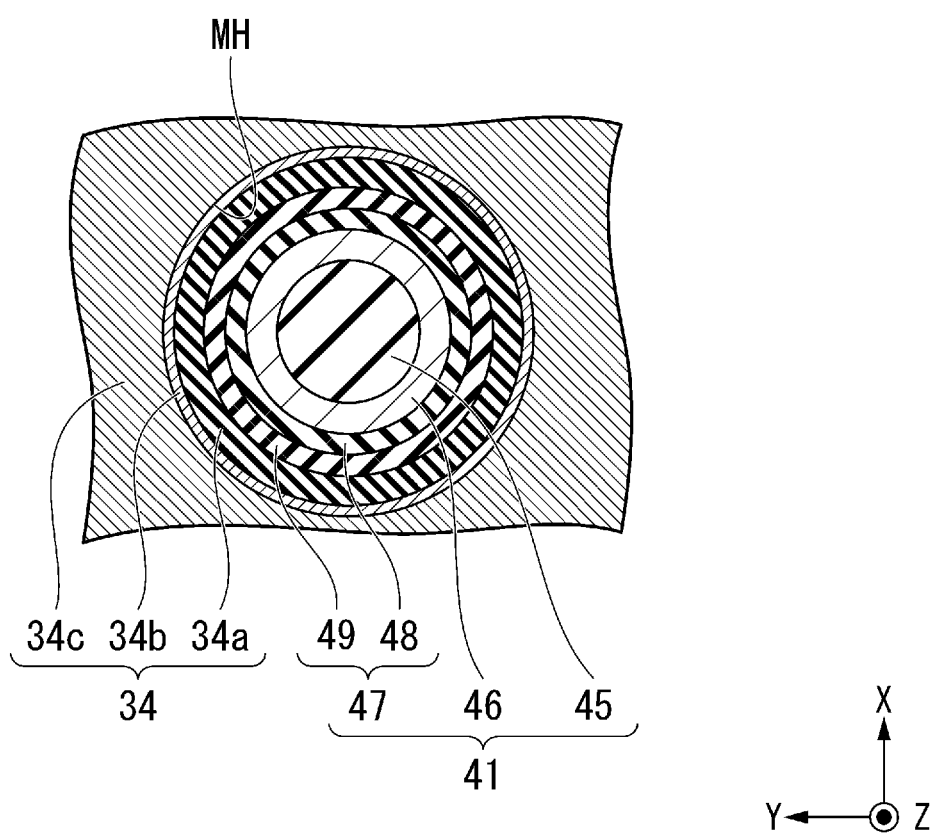
FIG. 7 is an enlarged cross-sectional view of the neighborhoods of the columnar body in the semiconductor storage device according to the first embodiment, taken along a conductive layer.

FIG. 7 is an enlarged cross-sectional view of the neighborhoods of the columnar body 41 in the semiconductor storage device according to the first embodiment, taken along the conductive layer 34. Each columnar body 41 has a core 45, a semiconductor body 46, and a memory film 47. The columnar body 41 is formed in a memory hole MH, and the core 45, the semiconductor body 46, and the memory film 47 are arranged in order from inside.

The core 45 extends in the Z direction and has a columnar shape. The core 45 contains, for example, a silicon oxide. The core 45 lies inside of the semiconductor body 46.

The semiconductor body 46 extends in the Z direction. The semiconductor body 46 is connected to one single-crystalline body 50 in a bottom portion of the columnar body 41. The semiconductor body 46 covers an outer side surface of the core 45. The semiconductor body 46 contains, for example, silicon. Silicon is, for example, polysilicon obtained by crystallizing amorphous silicon. The semiconductor body 46 is channels of the first select transistor S1, the memory cell transistors MT, and the second select transistor S2. The channel is a flow passage of carriers between a source side and a drain side.

The memory film 47 extends in the Z direction. The memory film 47 covers an outer side surface of the semiconductor body 46. The memory film 47 lies between an inner surface of the memory hole MH and the outer side surface of the semiconductor body 46. The memory film 47 includes, for example, a tunnel insulating film 48 and a charge accumulation film 49. The tunnel insulating film 48 is closer to the semiconductor body 46 than the charge accumulation film 49.

The tunnel insulating film 48 is located between the charge accumulation film 49 and the semiconductor body 46. The tunnel insulating film 48 contains, for example, a silicon oxide or a silicon oxide and a silicon nitride. The tunnel insulating film 48 is a potential barrier between the semiconductor body 46 and the charge accumulation film 49.

The charge accumulation film 49 is located between the insulating layers 33 and the conductive layers 34, and the tunnel insulating film 48. The charge accumulation film 49 contains, for example, a silicon nitride. Parts where the charge accumulation film 49 crosses the plurality of conductive layers 34 function as transistors, respectively. Each memory transistor MT stores data depending on whether or not charges are present in each part (charge accumulation section) where the charge accumulation film 49 crosses each of the plurality of conductive layers 34 or on an amount of accumulated charges. The charge accumulation section lies between each conductive layer 34 and the semiconductor body 46, and is surrounded by an insulating material.

Furthermore, a block insulating film 34a and a barrier film 34b may be provided between each insulating layer 33 and each conductive layer 34 and between each conductive layer 34 and the memory film 47.

The block insulating film 34a prevent back tunneling. The back tunneling is a phenomenon where charges return from the conductive layer 34 to the memory film 47. The block insulating film 34a is a stacked structure film in which, for example, a silicon oxide film, a metal oxide film, and a plurality of insulating films are stacked. An example of the metal oxide film is an aluminum oxide.

The barrier film 34b improves adhesiveness between a conductive portion 34c and the block insulating film 34a. When, for example, the conductive portion 34c is tungsten, the barrier film 34b is, for example, a stacked structure film of titanium nitride, titanium nitride, and titanium.

Furthermore, a cover insulating film may be provided between each insulating layer 33 and the charge accumulation film 49. The cover insulating film contains, for example, a silicon oxide. The cover insulating film protects the charge accumulation film 49 from etching at a tie of working. The cover insulating film is not necessarily provided or may be used as the block insulating film by leaving part of the cover insulating film between the conductive layer 34 and the charge accumulation film 49.

Figure 8:
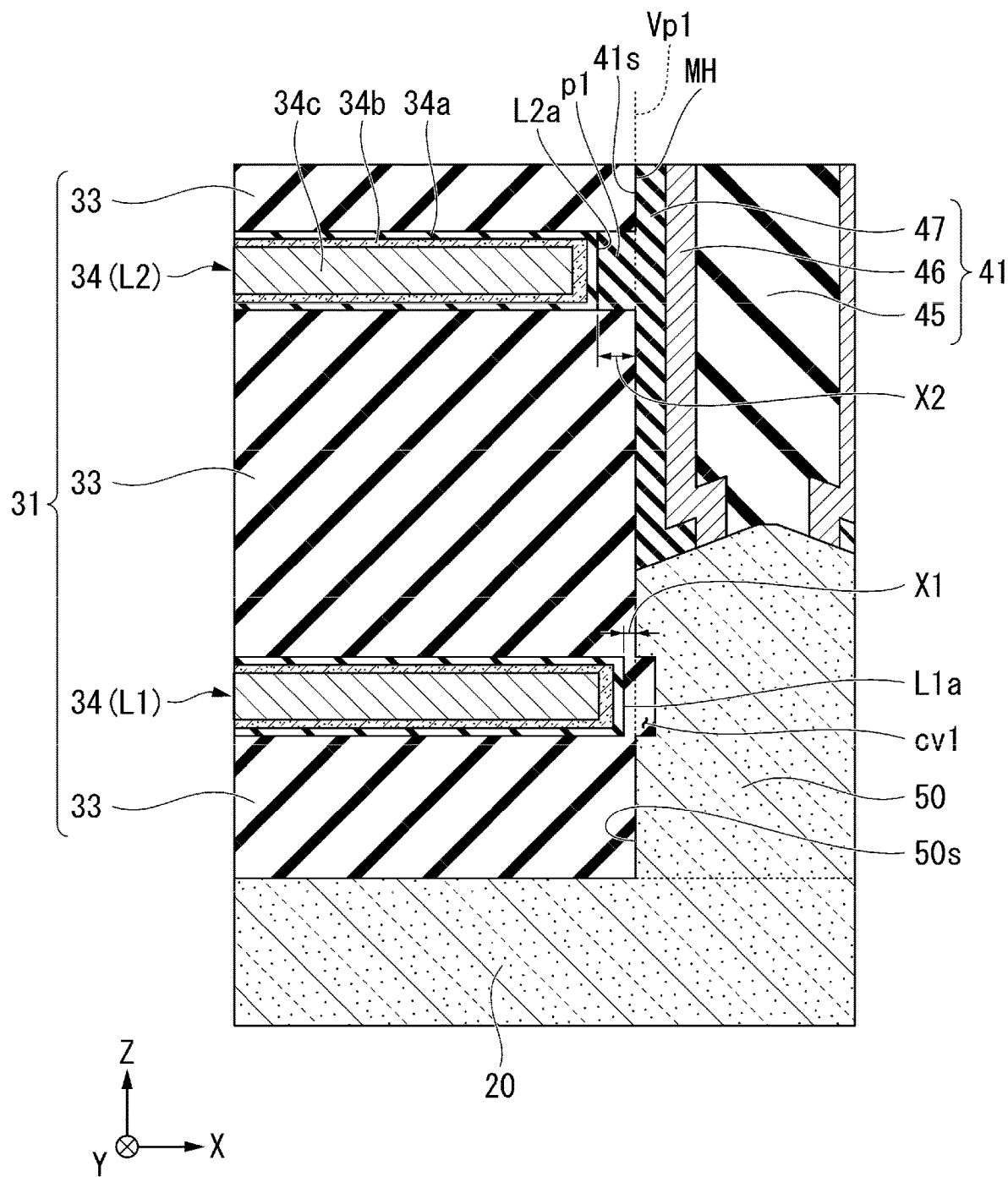
FIG. 8 is an enlarged cross-sectional view of neighborhoods of a single-crystalline body in the cell array region in the semiconductor storage device according to the first embodiment.

FIG. 8 is an enlarged cross-sectional view of neighborhoods of the single-crystalline body 50 in the cell array region CA in the semiconductor memory 1 according to the first embodiment. The single-crystalline body 50 projects from the substrate 20 into the memory hole MH in the stacked body 31. The single-crystalline body 50 lies between the columnar body 41 and the substrate 20 in the memory hole MH. The single-crystalline body 50 is, for example, silicon single crystal.

The columnar body 41 and the single-crystalline body 50 are present in the same memory hole MH. An outer side surface 41s of the columnar body 41 is continuous with an outer side surface 50s of the single-crystalline body 50. A plane extending along principal portions of the outer side surface 41s of the columnar body 41 and the outer side surface 50s of the single-crystalline body 50 will be referred to as "virtual plane Vp1." The virtual plane Vp1 is an example of a "first virtual plane." The columnar body 41 has a projection portion p1 that projects from the virtual plane Vp1 to the conductive layer 34 at a position where the columnar body 41 faces the conductive layer 34. The single-crystalline body 50 has a concave portion cv1 that is recessed from the virtual plane Vp1 in a direction apart from the conductive layer 34. The projection portion p1 and the concave portion cv1 are formed at the time of working.

Part of the single-crystalline body 50 is surrounded by the conductive layer 34. The conductive layer 34 has, for example, the block insulating film 34a, the barrier film 34b, and the conductive portion 34c. The conductive layer 34 that surrounds an outer periphery of the single-crystalline body 50 and that is closest to the substrate 20 among the conductive layers 34 will be referred to as a "first layer L1." Furthermore, the conductive layer 34 that surrounds an outer periphery of the columnar body 41 and that is closest to the substrate 20 among the conductive layers 34 will be referred to as a "second layer L2."

The second layer L2 is present outward of the first layer L1 in a radial direction of the columnar body 41 with reference to the columnar body 41. Furthermore, any of the conductive layers 34 surrounding the outer periphery of the columnar body 41 may be present outward of the first layer L1 in the radial direction of the columnar body 41 with reference to the columnar body 41.

A distance X2 between the virtual plane Vp1 and an inner peripheral surface L2a of the second layer L2 is longer than a distance X1 between the virtual plane Vp1 and an inner peripheral surface L1a of the first layer L1. The inner peripheral surface L1a is a surface of the first layer L1 closer to the columnar body 41. The inner peripheral surface L1a surrounds part of the outer side surface 50s of the single-crystalline body 50. The inner peripheral surface L2a is a surface of the second layer L2 closer to the columnar body 41. The inner peripheral surface L2a surrounds part of the outer side surface 41s of the columnar body 41. The distances X1 and X2 are radially shortest distances from the virtual plane Vp1 in the radial direction. A peripheral length of the inner peripheral surface L2a is larger than that of the inner peripheral surface L1a.

A difference between the distances X2 and X1 is, for example, equal to or smaller than 11 nm. Setting the difference between the distances X2 and X1 to be equal to or smaller than 11 nm makes it possible to provide more columnar bodies 40 between the adjacent slits SLT and to increase an integration density of the cell array region CA. Alternatively, the difference between the distances X2 and X1 may be, for example, equal to or smaller than 5 nm. Setting the difference between the distances X2 and X1 to be equal to or smaller than 5 nm makes it possible to allocate a volume of the second layer L2 and to prevent an increase in an interconnection resistance of the conductive layer 34. In another alternative, the difference between the distances X2 and X1 may be, for example, equal to or greater than 1 nm.

Figure 9:
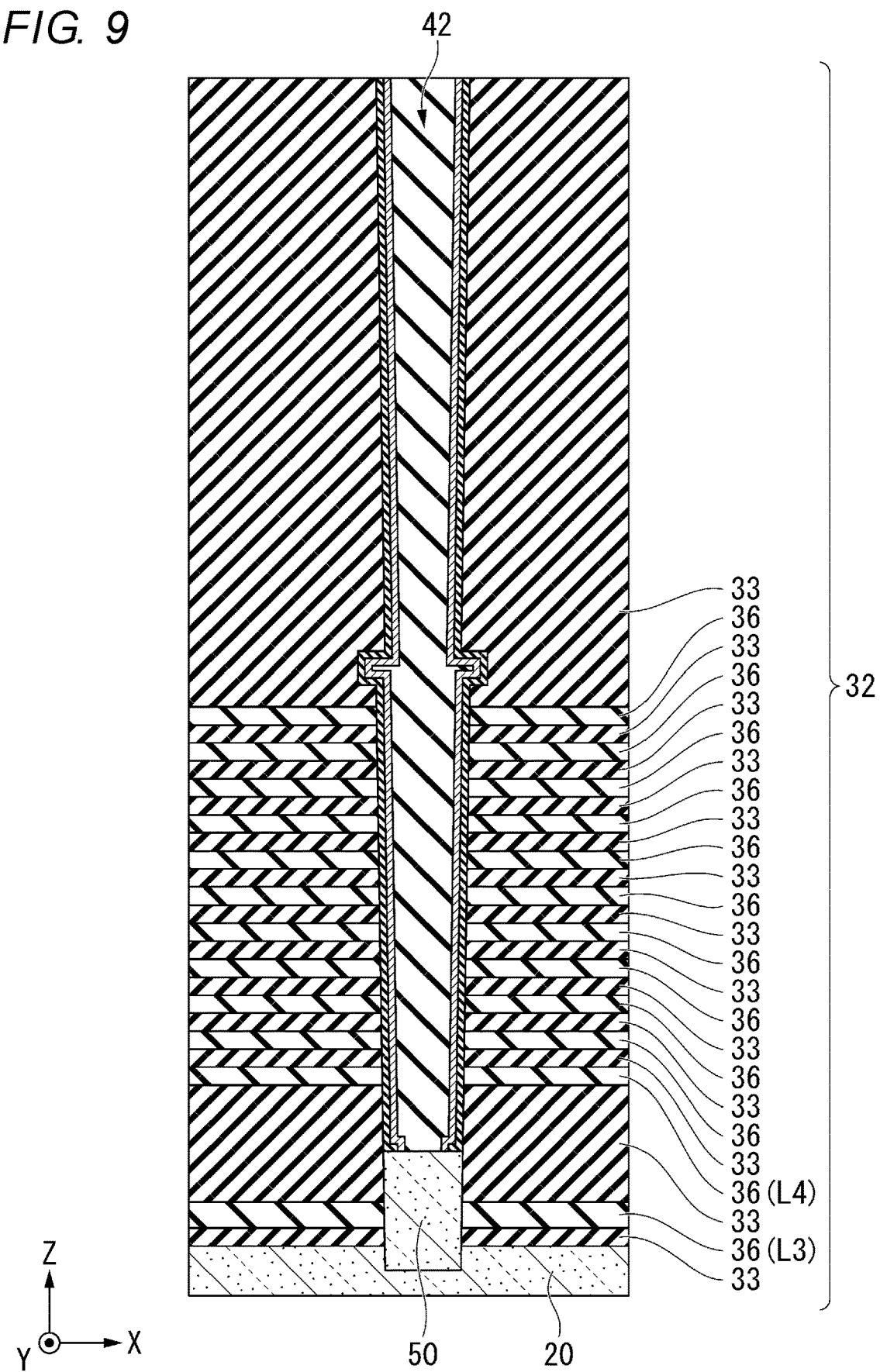
FIG. 9 is an enlarged cross-sectional view of neighborhoods of a columnar body in a stepped region in the semiconductor storage device according to the first embodiment.

FIG. 9 is an enlarged cross-sectional view of neighborhoods of the columnar body 42 in the stepped region ST in the semiconductor memory 1 according to the first embodiment. The stepped region ST has the substrate 20, a stacked body 32, the plurality of columnar bodies 42, and the plurality of single-crystalline bodies 50. The stacked body 32 is a part, which belongs to the stepped region ST, of the stacked body 30. The columnar body 42 is an example of a "second columnar body."

The stacked boy 32 has the plurality of insulating layers 33 and a plurality of insulating layers 36 in the Z direction. The insulating layers 33 and the insulating layers 36 are alternately stacked. The insulating layers 33 are spread over the cell array region CA and the stepped region St. Each of the insulating layers 36 is an example of a "second insulating layer." In the stacked body 32, the insulating layers 33 lie between one insulating layer 36 and the substrate 20 and between the insulating layers 36 adjacent in the Z direction.

The plurality of insulating layers 36 spread in the X and Y directions. A height position of each insulating layer 36 in the Z direction is identical to, for example, a height position of each conductive layer 34 in the stacked body 31. The insulating layers 36 are each, for example, silicon nitride. The number of insulating layers 36 varies depending on a position in the stepped region ST. The number of insulating layers 36 becomes smaller as the position is farther from the cell array region CA.

The plurality of columnar bodies 42 are present in the stacked body 32. The columnar bodies 42 extend in the Z direction. For example, the columnar bodies 42 penetrate the stacked body 32 in the Z direction. The columnar bodies 42 are support mediums supporting the stacked body 30 at the time of formation. The columnar bodies 42 may be either insulators or conductors, for example. The columnar bodies 42 are, for example, similar to the columnar bodies 41 in structure.

Figure 10:
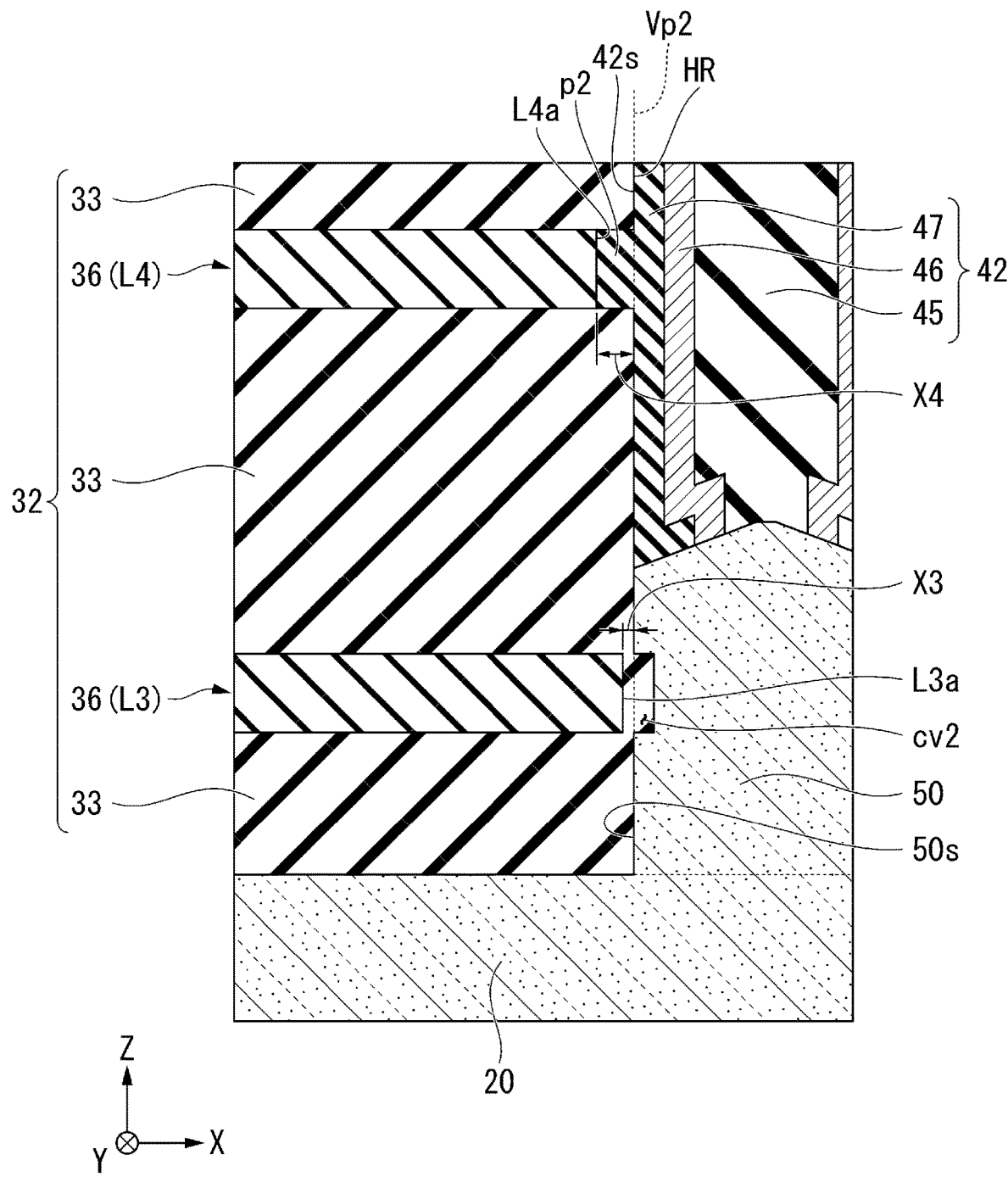
FIG. 10 is an enlarged cross-sectional view of the neighborhoods of the single-crystalline body in the stepped region in the semiconductor storage device according to the first embodiment.

FIG. 10 is an enlarged cross-sectional view of neighborhoods of the single-crystalline body 50 in the stepped region ST in the semiconductor memory 1 according to the first embodiment. The single-crystalline body 50 projects from the substrate 20 into a hole HR in the stacked body 32. The single-crystalline body 50 lies between the columnar body 42 and the substrate 20 in the hole HR.

The columnar body 42 and the single-crystalline body 50 are present in the same hole HR. An outer side surface 42s of the columnar body 42 is continuous with the outer side surface 50s of the single-crystalline body 50. A plane extending along principal portions of the outer side surface 42s of the columnar body 42 and the outer side surface 50s of the single-crystalline body 50 will be referred to as "virtual plane Vp2." The columnar body 42 has a projection portion p2 that projects from the virtual plane Vp2 to the insulating layer 36 at a position at which the columnar body 42 faces the insulating layer 36. The single-crystalline body 50 has a concave portion cv2 that is recessed from the virtual plane Vp2 in a direction apart from the insulating layer 36 at a position at which the single-crystalline body 50 faces the insulating layer 36. The projection portion p2 and the concave portion cv2 are formed at the time of working.

Part of the single-crystalline body 50 is surrounded by the insulating layer 36. The insulating layer 36 that surrounds the outer periphery of the single-crystalline body 50 and that is closest to the substrate 20 among the insulating layers 36 will be referred to as a "third layer L3." Furthermore, the insulating layer 36 that surrounds an outer periphery of the columnar body 42 and that is closest to the substrate 20 among the insulating layers 36 will be referred to as a "fourth layer L4."

The fourth layer L4 is present outward of the third layer L3 in the radial direction of the columnar body 42 with reference to the columnar body 42. Furthermore, any of the insulating layers 36 surrounding the outer periphery the columnar body 42 may be present outward of the third layer L3 in the radial direction of the columnar body 42 with reference to the columnar body 42.

A distance X4 between the virtual plane Vp2 and an inner peripheral surface L4a of the fourth layer L4 is longer than a distance X3 between the virtual plane Vp2 and an inner peripheral surface L3a of the third layer L3. The inner peripheral surface L3a is a surface of the third layer L3 closer to the columnar body 42. The inner peripheral surface L3a surrounds part of the outer side surface 50s of the single-crystalline body 50. The inner peripheral surface L4a is a surface of the fourth layer L4 closer to the columnar body 42. The inner peripheral surface L4a surrounds part of the outer side surface 42s of the columnar body 42. The distances X3 and X4 are radially shortest distances from the virtual plane Vp2. A peripheral length of the inner peripheral surface L4a is larger than that of the inner peripheral surface L3a.

A difference between the distances X4 and X3 is, for example, equal to or smaller than 11 nm. Alternatively, the difference between the distances X4 and X3 may be, for example, equal to or smaller than 5 nm. In another alternative, the difference between the distances X4 and X3 may be, for example, equal to or greater than 1 nm.

A method of manufacturing the cell array region CA and the stepped region ST in the semiconductor memory 1 according to the first embodiment will next be described. FIGS. 11 to 16 are cross-sectional views illustrating an example a method of manufacturing the semiconductor memory 1. FIGS. 11 to 16 are enlarged views of the neighborhoods of the single-crystalline body 50.

First, the insulating layers 33 and the insulating layers are alternately stacked on the substrate 20, thereby producing a stacked body. Next, a resist film is formed on an upper surface of the stacked body. Next, by repeating isotropic etching of the resist film and anisotropic etching of the stacked body via the resist film, the stacked body 30 is obtained. A part covered with the resist film serves as the cell array region CA, while a part from which the resist film is removed by the etching serves as the stepped region ST.

Figure 11:
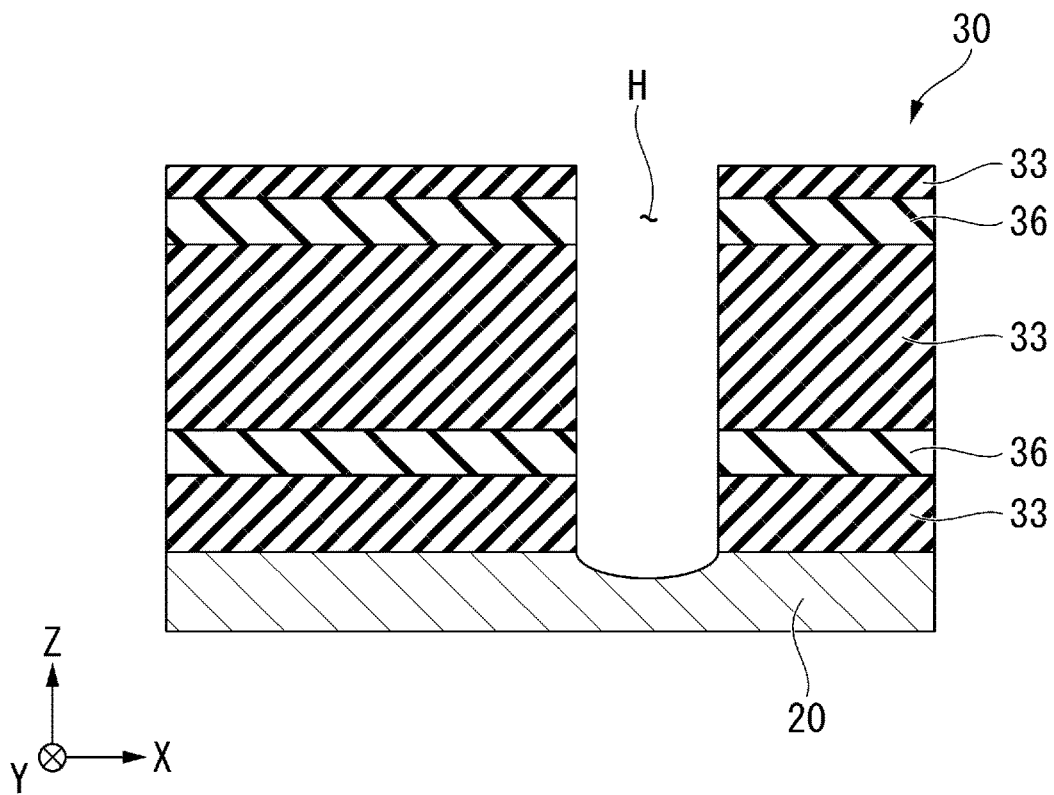
FIG. 11 is a cross-sectional view of characteristic portions in the semiconductor storage device, illustrating an example of a method of manufacturing the semiconductor storage device according to the first embodiment.

Next, a hole H is formed in the stacked body 30, as shown in FIG. 11. The hole H is produced by etching. The hole H is formed by, for example, performing anisotropic etching from the upper surface of the stacked body 30 to the substrate 20. The anisotropic etching is, for example, reactive ion etching (RIE). The hole H serves as the memory hole MH in the cell array region CA, while the hole H serves as the hole HR in the stepped region ST.

Figure 12:
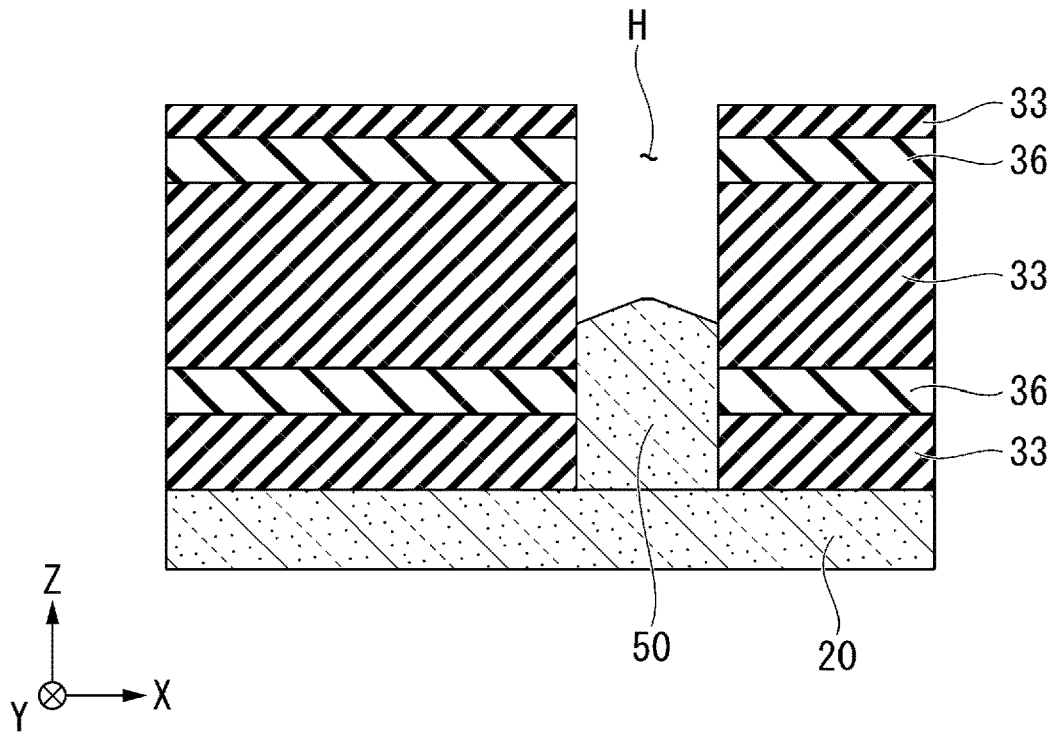
FIG. 12 is a cross-sectional view of the characteristic portions in the semiconductor storage device, illustrating the example of the method of manufacturing the semiconductor storage device according to the first embodiment.

Next, as shown in FIG. 12, silicon single crystal is epitaxially grown in the hole H. The single-crystalline body 50 is thereby formed in a lower end portion of the hole H.

Figure 13:
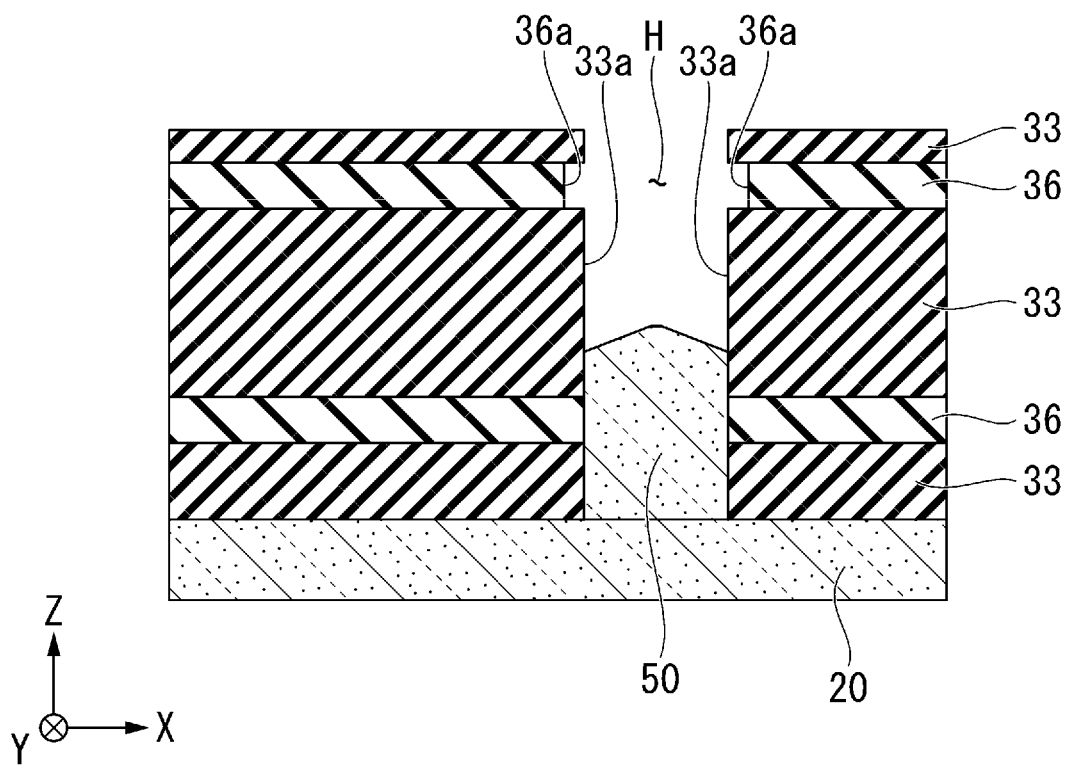
FIG. 13 is a cross-sectional view of the characteristic portions in the semiconductor storage device, illustrating the example of the method of manufacturing the semiconductor storage device according to the first embodiment.

Next, as shown in FIG. 13, the insulating layers 36 exposed to the hole H is subjected to recess etching. The recess etching is performed using an etchant capable of etching a silicon nitride more quickly than a silicon oxide. Inner peripheral surfaces 36a of the insulating layers 36 are recessed from inner peripheral surfaces 33a of the insulating layers 33 in the hole H. Performing the recess etching after formation of the single-crystalline body 50 enables the fourth layer L4 to be present outward of the third layer L3 in the radial direction of the hole H.

Figure 14:
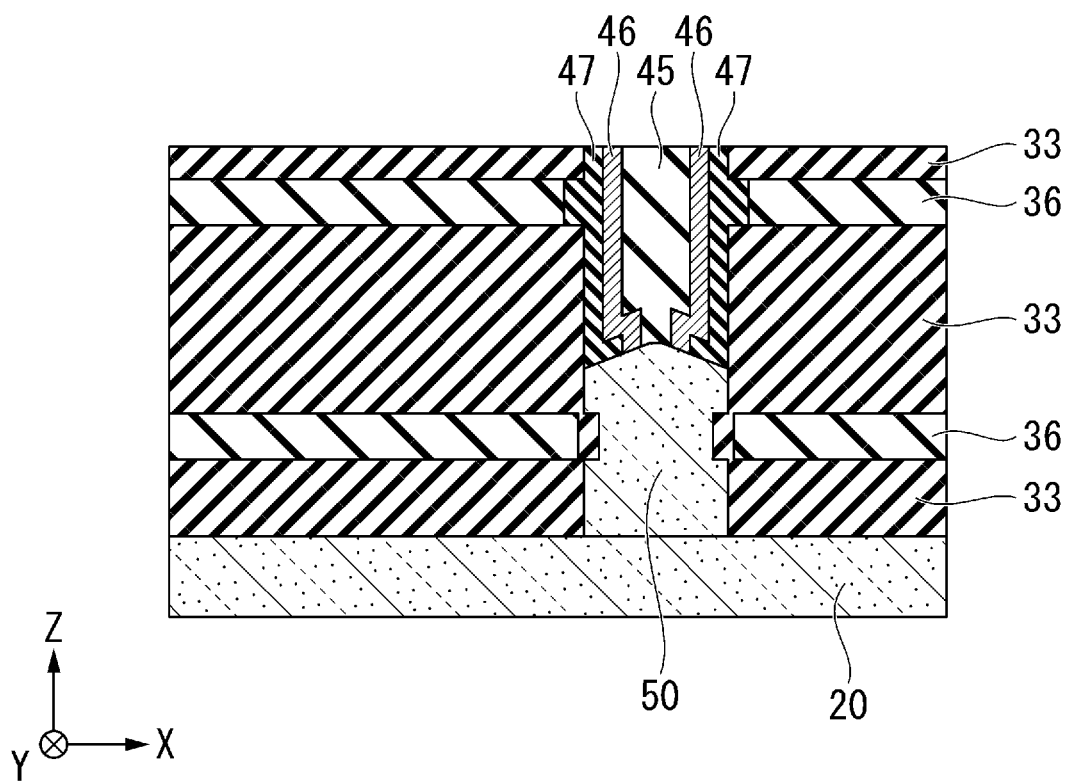
FIG. 14 is a cross-sectional view of the characteristic portions in the semiconductor storage device, illustrating the example of the method of manufacturing the semiconductor storage device according to the first embodiment.

Next, the memory film 47 is formed in the hole H. The memory film 47 is formed along an inner surface of the hole H. Next, an opening is formed in a bottom portion of the memory film 47 by anisotropic etching. Subsequently, the semiconductor body 46 and the core 45 are formed on an inner surface of the memory film 47. The semiconductor body 46 is also formed in the opening in the bottom portion of the memory film 47. Thus, the semiconductor body 46 is connected to the single-crystalline body 50. The columnar body 40 is then formed in the stacked body, as shown in FIG. 14.

Figure 15:
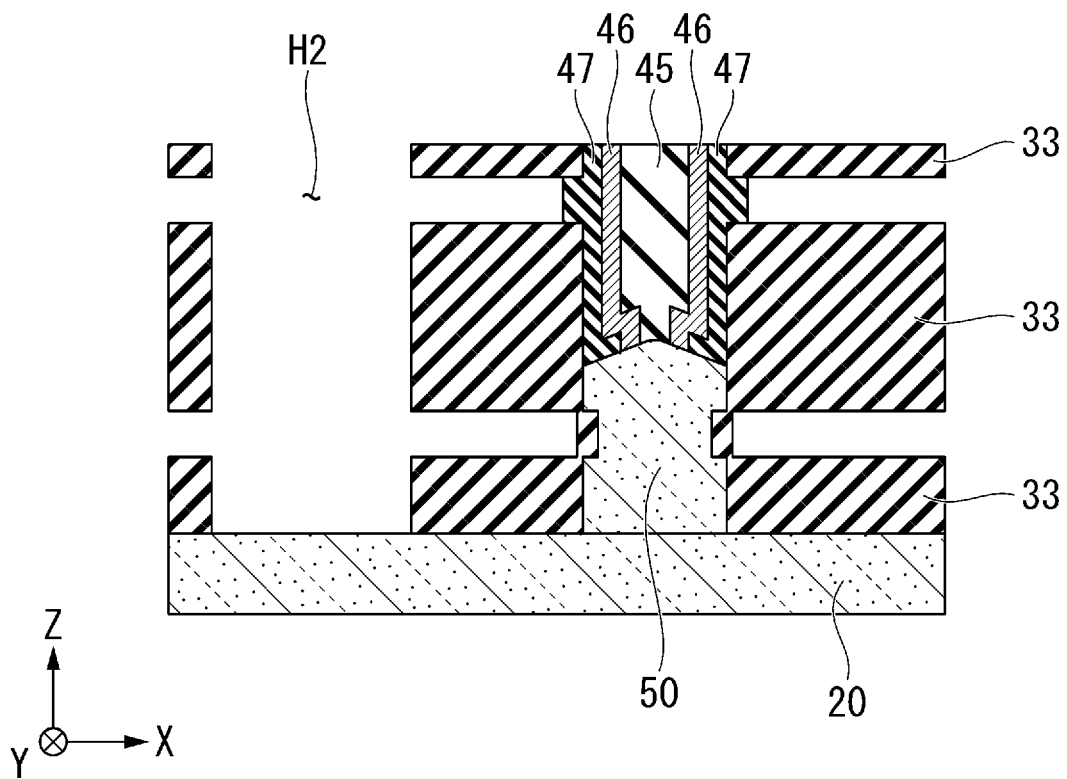
FIG. 15 is a cross-sectional view of the characteristic portions in the semiconductor storage device, illustrating the example of the method of manufacturing the semiconductor storage device according to the first embodiment.
Figure 16:
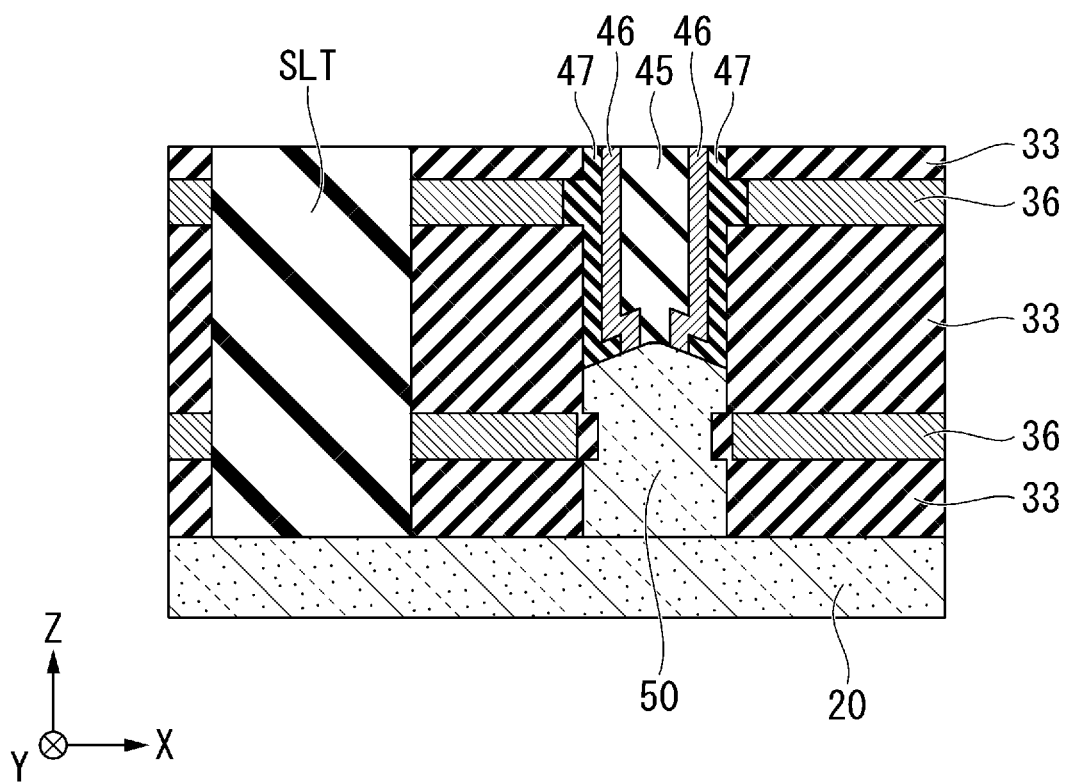
FIG. 16 is a cross-sectional view of the characteristic portions in the semiconductor storage device, illustrating the example of the method of manufacturing the semiconductor storage device according to the first embodiment.

Next, as shown in FIG. 15, a hole H2 to serve as each slit SLT is formed in the cell array region CA. Next, isotropic etching is performed on the insulating layers 36 in the cell array region CA via the hole H2. The insulating layers 36 in the cell array region CA are removed by the isotropic etching. When the slits SLT are not formed in the stepped region ST, the insulating layers 36 remain in the stepped region ST. That is, the stacked body 32 in the stepped region ST is kept in a state shown in FIG. 14.

Next, the block insulating film 34a, the barrier film 34b, and the conductive portions 34c are formed in the region from which the insulating layers 36 are removed in order. As a result, the conductive layers 34 are substituted for the insulating layers 36 in the cell array region CA. Next, each slit SLT is formed by burying an interior of the hole H2 with, for example, an insulator.

Through processes described above, the cell array region CA and the stepped region ST are produced. The manufacturing processes shown herein are given as an example, and other processes may be inserted between the processes.

According to the semiconductor memory 1 of the first embodiment, it is possible to prevent a short circuit between the first layer L1 and the single-crystalline body 50 and prevent a malfunction of the semiconductor memory 1.

Figure 17:
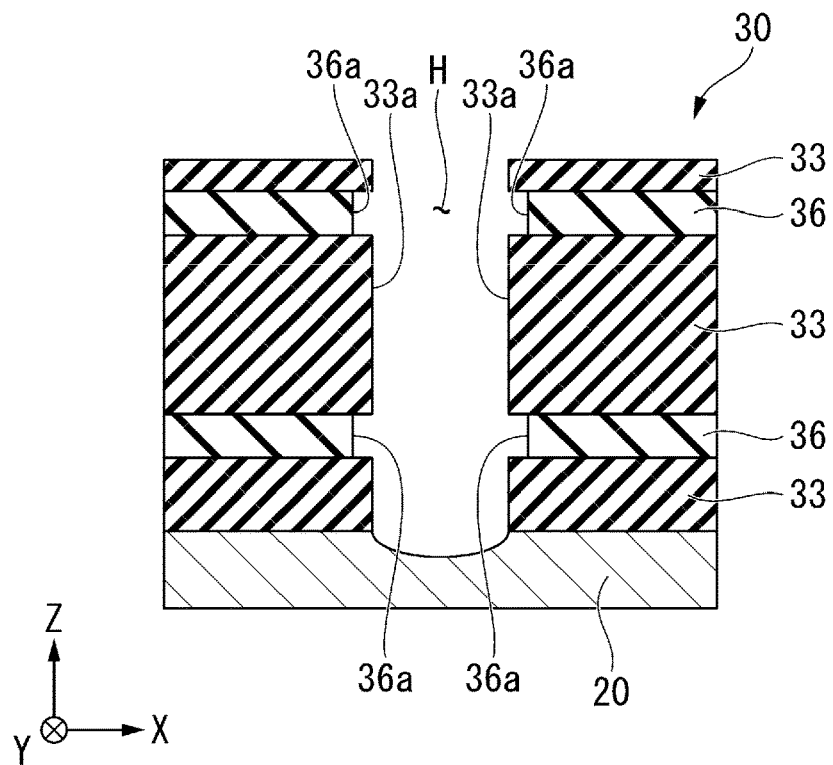
FIG. 17 is a cross-sectional view of characteristic portions in the semiconductor storage device, illustrating an example of a method of manufacturing the semiconductor storage device according to a comparison.
Figure 18:
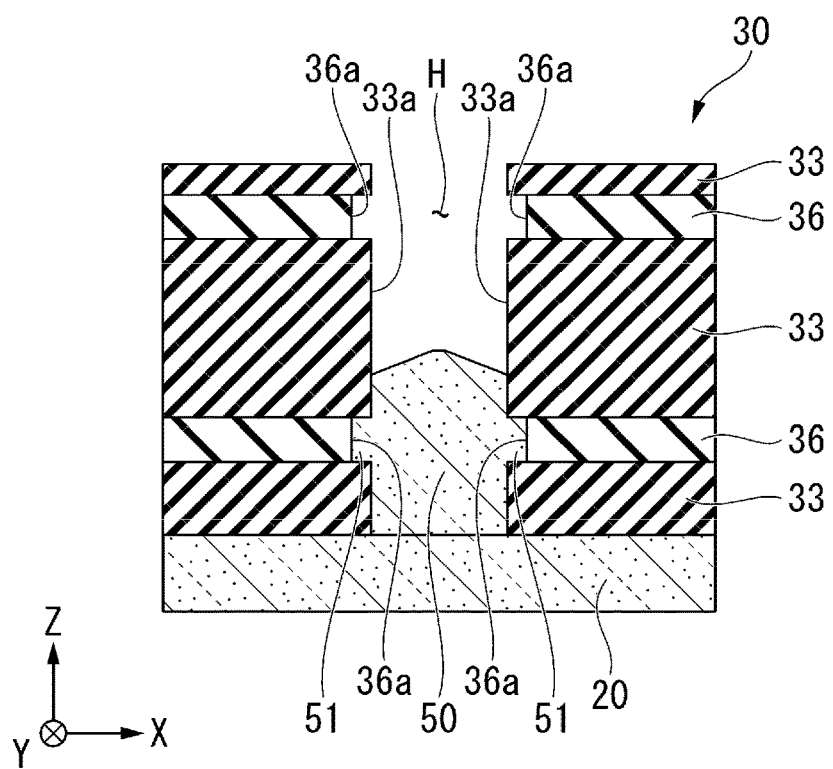
FIG. 18 is a cross-sectional view of the characteristic portions in the semiconductor storage device, illustrating the example of the method of manufacturing the semiconductor storage device according to the comparison.

As shown in FIG. 17, for example, when the hole H is formed in the stacked body 30 and then the recess etching is performed before crystal growth of the single-crystalline body 50, the inner peripheral surface 36a of the insulating layer 36 closest to the substrate 20 is also recessed from the inner peripheral surfaces 33a of the insulating layers 33 in the hole H. As shown in FIG. 18, when the single-crystalline body 50 is then formed, convex portions 51 are formed in the single-crystalline body 50. The convex portions 51 are grown in XY in-plane directions during the crystal growth. The crystal growth of portions of the single-crystalline body 50 other than the convex portions 51 is in the Z direction in principle, while only the crystal growth of the convex portions 51 is in the X and Y directions. As a result, a stacking fault tends to occur in (111) planes of the convex portions 51. An influence of this stacking fault remains even after substituting the conductive layers 34 for the insulating layers 36. As a result, when a voltage is applied to the conductive layers 34 surrounding a periphery of the single-crystalline body 50, then a high electric field is locally applied to a part influenced by the stacking fault, and a short-circuit possibly occurs.

In the semiconductor memory 1 according to the first embodiment, by contrast, the recess etching is performed after growth of the single-crystalline body 50, as shown in FIGS. 12 and 13. Owing to this, the crystal growth of the single-crystalline body 50 is in the Z direction in principle without formation of the convex portions 51. This can prevent occurrence of the stacking fault in the semiconductor memory according to the first embodiment. As described above, the stacking fault is one cause for a short-circuit between the first layer L1 and the single-crystalline body 50. Preventing occurrence of the stacking fault, therefore, makes it possible to reduce occurrence of the short-circuit between the first layer L1 and the single-crystalline body 50.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a substrate;
a stacked body disposed on the substrate and including a plurality of first insulating layers and a plurality of conductive layers alternately stacked in a first direction;
a first columnar body extending in the first direction in the stacked body;
a first single-crystalline body connected to an end of the first columnar body and disposed between the first columnar body and the substrate, wherein
the first columnar body includes a semiconductor body and a charge accumulation film disposed between at least one of the plurality of conductive layers and the semiconductor body,
the plurality of conductive layers include a first conductive layer that surrounds an outer periphery of the first single-crystalline body and is closest to the substrate among the plurality of conductive layers surrounding the outer periphery of the first single-crystalline body, and a second conductive layer that surrounds an outer periphery of the first columnar body and is closest to the substrate among the plurality of conductive layers surrounding the outer periphery of the first columnar body,
an end of the first conductive layer is disposed outward of an outer side surface of the first single-crystalline body in a radial direction of the first columnar body with respect to the first columnar body,
an end of the second conductive layer is disposed outward of an outer side surface of the first columnar body in a radial direction of the first columnar body with respect to the first columnar body, and
the end of the second conductive layer is disposed outward of the end of the first conductive layer in a radial direction of the first columnar body with respect to the first columnar body;
a second columnar body extending in the first direction in the stacked body; and
a second single-crystalline body connected to an end of the second columnar body and disposed between the second columnar body and the substrate, wherein
the stacked body includes a cell array region and a stepped region,
the stepped region includes the plurality of first insulating layers and a plurality of second insulating layers alternately stacked therein,
the first columnar body is disposed in the cell array region,
the second columnar body is disposed in the stepped region, and
the plurality of second insulating layers include a third layer that surrounds the outer periphery of the second single-crystalline body and that is closest to the substrate among the plurality of second insulating layers, and a fourth layer that surrounds an outer periphery of the second columnar body and that is closest to the substrate among the plurality of second insulating layers,
an end of the fourth layer is disposed outward of an end of the third layer in a radial direction of the second columnar body with respect to the second columnar body.

2. The semiconductor storage device according to claim 1, wherein
a difference between a first distance from a first virtual plane extending along an outer side surface of the first columnar body to an inner peripheral surface of the second conductive layer, and a second distance from the first virtual plane to an inner peripheral surface of the first conductive layer, is equal to or smaller than 11 nm.

3. The semiconductor storage device according to claim 2, wherein the columnar body has a projection portion that projects from the first virtual plane to the first conductive layer.

4. The semiconductor storage device according to claim 2, wherein the first single-crystalline body has a concave portion that is recessed from the first virtual plane in a direction apart from the first conductive layer.

5. The semiconductor storage device according to claim 2, wherein
the difference between the first distance from the first virtual plane to the inner peripheral surface of the second conductive layer, and the second distance from the first virtual plane to the inner peripheral surface of the first conductive layer, is equal to or smaller than 5 nm.

6. The semiconductor storage device according to claim 2, wherein the difference between the first distance from the first virtual plane to the inner peripheral surface of the second conductive layer, and the second distance from the first virtual plane to the inner peripheral surface of the first conductive layer, is equal to or greater than 1 nm.

7. The semiconductor storage device according to claim 1, wherein a difference between a distance from a second virtual plane extending along an outer side surface of the second columnar body to an inner peripheral surface of the fourth layer, and a distance from the second virtual plane to an inner peripheral surface of the third layer, is equal to or smaller than 11 nm.

8. The semiconductor storage device according to claim 7, wherein the difference between the distance from the second virtual plane to the inner peripheral surface of the fourth layer, and the distance from the second virtual plane to the inner peripheral surface of the third layer, is equal to or smaller than 5 nm.

* * * * *